United States Patent [19]

Stimmell

[11] Patent Number: 4,589,056
[45] Date of Patent: May 13, 1986

[54] TANTALUM SILICIDE CAPACITOR

[75] Inventor: James B. Stimmell, Sunnyvale, Calif.

[73] Assignee: National Semiconductor Corporation, Santa Clara, Calif.

[21] Appl. No.: 660,991

[22] Filed: Oct. 15, 1984

[51] Int. Cl.[4] .......................... H01G 4/06; H01G 9/00; H01G 7/00
[52] U.S. Cl. .................................. 361/311; 29/25.42; 361/433
[58] Field of Search ............... 361/433, 311, 314, 315; 29/570, 569 R, 25.42; 148/1.5, 171, 172, 173; 156/625, 653, 652; 357/23.6, 49

[56] References Cited

U.S. PATENT DOCUMENTS

| | | | |
|---|---|---|---|
| 3,614,548 | 10/1971 | Inoue | 357/23.6 X |
| 3,869,652 | 3/1975 | Maillot | 361/433 |
| 4,506,434 | 3/1985 | Ogawa et al. | |

Primary Examiner—L. T. Hix
Assistant Examiner—Douglas S. Lee
Attorney, Agent, or Firm—Michael J. Pollock; Paul J. Winters; Gail W. Woodward

[57] ABSTRACT

A high capacitance/low leakage capacitor for use in a dynamic RAM cell fabricated from a metal silicide or metal silicide/poly capacitor plate structure, with formation of an anodic metal/silicon/oxygen insulating film over that structure.

7 Claims, 1 Drawing Figure

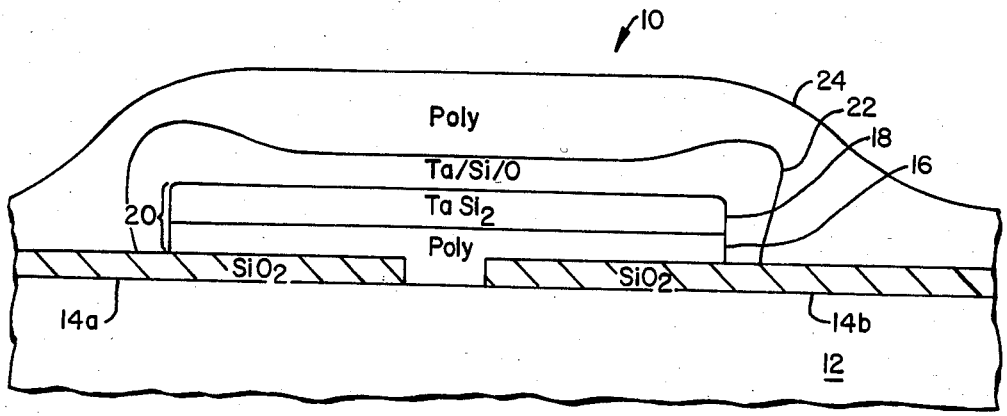
FIG._1.

TANTALUM SILICIDE CAPACITOR

BACKGROUND OF THE INVENTION

1. Field of the Invention

This invention relates generally to semiconductor structures and processes, and more particularly to an improved silicide capacitor design and its method of manufacture.

2. Description of the Prior Art

Recent advances in integrated circuit processing technology, especially in lithography and dry etching, have significantly reduced device dimensions. To improve yields and lower prices, it is, of course, desirable to reduce device dimensions as much as possible.

Dynamic RAM (Random Access Memory) technology requires the fabrication of extremely small, low leakage capacitors in each memory cell. The fundamental limits governing the minimum size of these capacitors, and hence the memory cell size, can be expressed as follows:

Minimizing the area, A, of the memory capacitor is subject to $A/t\epsilon V \geq Q_c$ (critical charge constraint)
$V/t \leq E$ (field strength constraint)
$t \geq t_{min}$ (dielectric integrity constraint)
where t is the thickness of the capacitor dielectric;
$\epsilon$ is the dielectric constant;
V is the voltage across the capacitor;
E is the maximum acceptable electric field strength;
$t_{min}$ is the the minimum dielectric thickness such that the integrity is not jeopardized by pinholes; and
$Q_c$ is the minimum charge difference needed to distinguish a stored "1" from a stored "0".

Rewriting the constraints:
$t \leq A \epsilon/Q_c V$
$t \geq 1/E \, V$
$t \geq t_{min}$.

The optimal solution, i.e., minimum value of A, can be written as $A_{min} \epsilon/Q_c V = 1/E \, V$ thus $A_{min} = Q_c/\epsilon E$.

This solution is optimal for all values of t greater than $t_{min}$ which satisfy the equation $V/t = E$.

With present technology for a dynamic RAM to have useful signal levels and soft-error immunity the cell capacitor needs to store about 300,000 electrons ($Q_c$). Additionally because the capacitor dielectric must withstand the operating voltage (E), the minimum capacitor area ($A_{min}$) is heavily dependent upon the dielectric material used ($\epsilon$).

Prior art techniques utilize capacitor dielectrics of silicon dioxide ($SiO_2$), silicon nitride ($Si_3N_4$) or a silicon depletion region. Capacitors constructed from these materials have several deficiencies. For example, they have a limited storage capacity thereby restricting the minimum size of the capacitor. Furthermore, their poor edge coverage and etching difficulties result in capacitor periphery shorting. In addition, formation of pinholes through the capacitor dielectric severly limits yield.

Another prior method utilizes tantalum pentoxide ($Ta_2O_5$) film as the capacitor dielectric. See, for example, McLean et al., Proc. IEEE, 52, 1450 (1964). Attempts to apply tantalum pentoxide film as the storage capacitor in highly integrated dynamic MOS random access memories to form a large capacitance have been reported in Kayanagi et al., Jpn. J. Appl. Phys., 18-1, 135 (1978) and Ohta et al., IEEE Trans. Electron. Devices, ed-29, 368 (1982). Furthermore, tantalum pentoxide film is a promising material for enabling large capacitance in proposed very large scale integration devices. This is due to the exceptional dielectric characteristics of tantalum pentoxide film, as compared to other prior art dynamic RAM capacitor dielectric materials (See Table 1).

TABLE 1

| | DRAM Capacitor Dielectric Materials | | | |
|---|---|---|---|---|
| Material | Dielectric Constant | Eb (MV/$cm^2$) | $\epsilon$ Eb (fC/$u^2$) | Cap size (sq u) |
| $SiO_2$ | 4 | 10 | 35 | 4.6 |
| $Si_3N_4$ | 7 | 10 | 60 | 2.6 |
| $Ta_2O_5$ | 25 | 6–8 | 150 | 1.1 |

As can be seen from the Table, tantalum pentoxide has a dielectric constant of about 25, and tantalum capacitors are capable of storing 2 to 3 times as much charge per unit area as prior art nitride capacitors. Accordingly, use of tantalum pentoxide as a dielectric permits a drastic reduction in capacitor area required for a dynamic RAM cell.

The use of tantalum pentoxide as the capacitor dielectric also reduces yield loss that would result from capacitor dielectric shorts such as edge shorts and pinholes, The nature of tantalum pentoxide film growth is such that the films are inherently pinhole-free and slightly thickened at the edges. This enhanced perimeter thickness reduces the likelihood of edge shorts, which are a particular problem for nitride capacitors.

Conventional tantalum pentoxide films are formed by anodic oxidation of a tantalum film in a wet solution, or, alternatively, using reactive sputtering of a metallic tantalum target. Standard MOSRAM fabrication techniques, however, require high temperature annealing (near 1000° C.) after the dielectric film has been deposited. It has been determined that high temperatures (>400° C.) cause polycrystallization of the tantalum pentoxide film, and/or formation of pinholes through the film, creating high leakage current and rendering the film unusable as a dielectric. In a recent study by Kimura et al. ("Leakage-Current Increase in Amorphous $Ta_2O_5$ Films Due to Pinhole Growth During Annealing Below 600° C.," Journal of the Electrochemical Society, Vol. 130, No. 12, December, 1983), the authors conclude that ("all processing which follows capacitor dielectric deposition must be restricted to low temperatures...")it is necessary to have a low temperature process for tantalum pentoxide film to be applied to large scale integration as a dielectric material.

In addition, it has been found that tantalum pentoxide film is similarly unstable in the presence of high electric fields, further limiting its application as a dielectric in some devices. These factors severely limit the potential application of tantalum pentoxide capacitors, and more than offset its otherwise attractive dielectric properties.

SUMMARY OF THE INVENTION

An improved dynamic RAM capacitor can be fabricated from a metal silicide or metal silicide/polycrystalline silicon capacitor plate structure, with formation of an anodic metal/silicon/oxygen insulating film over that structure. By proper selection of the silicide material used, significant reduction in the size of the capacitor, and thus the memory cell, can be achieved, without the accompanying deficiencies of periphery shorting and pinhole formation. Furthermore, the resultant dielectric exhibits high-temperature stability, thereby rendering it suitable for use in conventional MOSRAM fabrication processes. In addition, this dielectric is stable even in the presence of high electric fields.

In the preferred embodiment, the proposed structure consists of a tantalum silicide ($TaSi_2$) conductor covered by a layer of anodized tantalum/silicon/oxygen ($Ta_2Si_xO_y$) dielectric. Other materials can be used to form the capacitor conductor. For example, the silicides of niobium, zirconium or titanium (the "valve" metals, which form a nonporous electrically insulating film) or other anodizable metals could be used in place of tantalum silicide, with similar benefits over the prior art.

The tantalum silicide capacitor structure of this invention is formed by first depositing a layer of tantalum silicide onto a layer of polycrystalline silicon. This deposition can be accomplished by sputtering, co-sputtering, chemical vapor deposition, or any other suitable thin-film deposition technique.

The tantalum silicide layer thus deposited is then oxidized to form a tantalum/silicon/oxygen overlayer. This oxidation can be accomplished by anodization, using commonly available electrolytes such as ammonia or dilute sulfuric acid. In the preferred embodiment ammonium pentaborate in ethelene glycol is used. The resultant film thickness can be accurately controlled by regulating the anodization voltage. As an alternative to anodization, sputtering, chemical vapor deposition or heat pulse annealing in an oxidizing atmosphere could be used to form the film. layer. Addition of a conductive top layer completes the structure, and forms a capacitor with tantalum/silicon/oxygen as the dielectric. A further alternative embodiment utilizes a tantalum over tantalum silicide composite layer. This composite layer is then anodized to form the tantalum/silicon/oxygen overlayer.

The resultant high capacitance/low leakage dielectric has application in all dynamic RAM products, particularly 256k bit and larger devices. Furthermore, because of its high temperature stability, the capacitor is easily integrable into the conventional IC fabrication process. In addition, the capacitor can be used in devices generating high electric fields, without fear of dielectric failure.

BRIEF DESCRIPTION OF THE DRAWINGS

FIG. 1 is a cross-sectional view of the tantalum silicide capacitor of this invention, illustrating the basic silicide layer and its oxidized overlayer.

DETAILED DESCRIPTION OF A PREFERRED EMBODIMENT

FIG. 1 is a cross-sectional view of the structure of a tantalum silicide capacitor 10. Semiconductor silicon substrate 12, preferably of P-conductivity [100]orientation, is overlain by silicon dioxide layer 14a, b and polycrystalline silicon layer 16. This base structure can be fabricated using well known techniques, for example, by oxidizing silicon 12 and etching the resulting silicon dioxide to form the desired pattern, then depositing polycrystalline silicon layer 16 over the patterned silicon dioxide 14. The pattern enables the polycrystalline silicon layer 16 to contact substrate 12 at desired locations to thereby electrically connect what will be the overlying capacitor to specified devices in the substrate.

Tantalum silicide layer 18 is deposited over polysilicon layer 16 by sputtering, co-sputtering, chemical vapor deposition, or any other suitable thin-film deposition technique. Co-sputtering has been found to be the most versatile process; any silicide can be deposited at any desired stoichiometry, the stoichiometry can be varied during deposition to produce graded films, and targets of high purity are available from many different vendors.

Once deposited, tantalum silicide layer 18 and polycrystalline silicon layer 16 can be simultaneously etched using well known techniques to form the lower plate 20 of the capacitor structure. Then lower plate 20 is covered by the capacitor dielectric layer 22, in this case, a film of tantalum/silicon/oxygen. This film can be produced in a number of ways. For example, anodic oxidation of the tantalum silicide layer in an electrolyte solution creates a film of the dielectric, the thickness of which can be controlled by appropriate regulation of the anodization voltage. The film can also be created by sputtering or chemical vapor deposition of tantalum oxide or tantalum pentoxide. Alternatively, controlled thermal oxidation could be used.

The resultant oxide, from whatever source, has been found to incorporate silicon as "impurity" thereby rendering the film stoichiometrically distinct from pure tantalum pentoxide. This presence of silicon produces a significantly more stable dielectric than pure tantalum pentoxide, and is not subject to crystallization at high temperature or high electric fields.

The dielectric layer 22 is covered with a conductive top layer 24, which forms the top electrode and completes the capacitor structure. This top layer is preferably composed of polycrystalline silicon, which has been doped with an impurity to increase its electrical conductivity.

While this invention has been described in connection with preferred embodiments thereof, it is obvious that modifications and changes therein may be made by those skilled in the art to which it pertains without departing from the spirit and scope of the invention. For example, the lower plate 20 of the capacitor structure could be constructed of alternating layers of tantalum oxide and silicon, which could then be oxidized to form the tantalum/silicon/oxygen dielectric film. Furthermore, the dielectric could be formed by the reactive sputtering of a tantalum silicide target in an argon/oxygen atmosphere, or a tantalum pentoxide target in an argon/silicon atmosphere. Accordingly, the scope of this invention is to be limited only by the appended claims.

I claim:

1. A capacitor for an integrated circuit comprising:
   a first electrically conductive layer composed of a silicide bearing material;
   a dielectric layer disposed over said first electrically conductive layer, said dielectric layer including oxides of said silicide components whereby said dielectric layer comprises a compound of metal, silicon and oxygen; and
   a second electrically conductive layer disposed over said dielectric layer.

2. The capacitor of claim 1 wherein said dielectric layer comprises an oxidized portion of said first electrically conductive region.

3. The capacitor of claim 2 wherein said first electrically conductive region is composed of the silicide of an anodizable metal.

4. The capacitor of claim 3 wherein said first electrically conductive region is composed of the silicide of one of the group of valve metals including tantalum, niobium, zirconium, or titanium.

5. The capacitor of claim 1 wherein said first electrically conductive region comprises tantalum silicide.

6. The capacitor of claim 1 wherein said second electrically conductive layer comprises one of polycrystalline silicon, aluminum or a silicide.

7. The capacitor of claim 6 wherein said second electrically conductive layer comprises polycrystalline silicon and is doped with an impurity to increase electrical conductivity.

* * * * *